(12) United States Patent
Williamson et al.

(10) Patent No.: US 11,243,077 B2
(45) Date of Patent: Feb. 8, 2022

(54) GYROSCOPE

(71) Applicant: Atlantic Inertial Systems Limited, Plymouth (GB)

(72) Inventors: Matthew Williamson, Plymouth (GB); John Keith Sheard, Plymouth (GB); Christopher M. Gregory, Plymouth (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 114 days.

(21) Appl. No.: 16/679,521

(22) Filed: Nov. 11, 2019

(65) Prior Publication Data

US 2020/0200536 A1   Jun. 25, 2020

(30) Foreign Application Priority Data

Dec. 21, 2018 (GB) ..................................... 1821021

(51) Int. Cl.
*G01C 19/5726* (2012.01)
*B81B 3/00* (2006.01)
(Continued)

(52) U.S. Cl.
CPC ........ *G01C 19/5726* (2013.01); *B81B 3/0021* (2013.01); *G01C 19/5677* (2013.01);
(Continued)

(58) Field of Classification Search
CPC ............ G01C 19/5776; G01C 19/5677; G01C 19/5684; G01C 19/24; G01C 19/28; G01C 19/42; G01C 19/5726; G01C 19/5755

See application file for complete search history.

(56) References Cited

U.S. PATENT DOCUMENTS

| | | | |
|---|---|---|---|
| 3,902,374 A | * | 9/1975 | Hoffman ................ G01C 19/42 74/5.6 D |
| 5,419,194 A | | 5/1995 | Varnham et al. |

(Continued)

FOREIGN PATENT DOCUMENTS

| | | |
|---|---|---|
| CN | 104063242 A | 9/2014 |
| EP | 1189023 A2 | 3/2002 |
| WO | 2010007406 A2 | 1/2010 |

OTHER PUBLICATIONS

European Search Report for Application No. 19211755.4, dated May 13, 2020, 8 pages.
(Continued)

*Primary Examiner* — Helen C Kwok
(74) *Attorney, Agent, or Firm* — Cantor Colburn LLP

(57) ABSTRACT

A vibrating structure gyroscope includes a permanent magnet, a structure arranged in a magnetic field of the permanent magnet and arranged to vibrate under stimulation from at least one primary drive electrode and a drive system that includes: one primary drive electrode arranged at least one primary sense electrode arranged to sense motion in the vibrating structure and a drive control loop controlling the primary drive electrode dependent on the primary sense electrode. The structure also includes a compensation unit arranged to receive a signal from the drive system representative of a gain in the drive control loop and arranged to output a scale factor correction based on that signal. As the magnet degrades (e.g. naturally over time as the material ages), the magnetic field weakens. To compensate for this, the primary drive control loop will automatically increase the gain.

12 Claims, 2 Drawing Sheets

(51) Int. Cl.
*G01C 19/5755* (2012.01)
*G01C 19/5677* (2012.01)
*G01C 19/5684* (2012.01)

(52) U.S. Cl.
CPC ..... *G01C 19/5684* (2013.01); *G01C 19/5755* (2013.01); *B81B 2201/0242* (2013.01)

(56) References Cited

U.S. PATENT DOCUMENTS

| | | | |
|---|---|---|---|
| 5,895,851 A * | 4/1999 | Kano | G01P 15/124 |
| | | | 73/504.04 |
| 7,801,694 B1 * | 9/2010 | Watson | G01C 19/56 |
| | | | 702/104 |
| 8,347,718 B2 | 1/2013 | Malvern et al. | |
| 2003/0074968 A1 * | 4/2003 | Fell | G01C 19/567 |
| | | | 73/504.12 |
| 2010/0058831 A1 | 3/2010 | Jeanroy et al. | |
| 2011/0167911 A1 * | 7/2011 | Fell | G01C 19/5684 |
| | | | 73/504.12 |
| 2013/0105921 A1 * | 5/2013 | Najafi | G01C 19/574 |
| | | | 257/415 |
| 2017/0153109 A1 * | 6/2017 | Lin | G01C 19/56 |
| 2017/0343351 A1 * | 11/2017 | Tormalehto | G01C 19/5733 |

OTHER PUBLICATIONS

Intellectual Property Office Search Report for International Application No. GB1821021.1 dated Jun. 18, 2019, 4 pages.

* cited by examiner

GYROSCOPE

FOREIGN PRIORITY

This application claims priority to United Kingdom Application No. 1821021.1 filed Dec. 21, 2018, the entire contents of which is incorporated herein by reference.

TECHNICAL FIELD

The present disclosure relates to vibrating structure gyroscopes, particularly Microelectromechanical Systems (MEMS)-based vibrating structure gyroscopes for the measurement of angular rate(s), e.g. in inertial measurement units (IMUs). The present disclosure is concerned in particular with inductive gyroscopes.

BACKGROUND

Gyroscopes are sensors that measure angular rate (i.e. the rate of rotation). Gyroscopes are used in many applications, including inertial navigation, robotics, avionics, and automobiles. In inertial navigation applications, gyroscopes may be found in self-contained systems known as "inertial measurement units" (IMUs). IMUs typically contain a plurality of accelerometers and/or gyroscopes, and provide an estimate of an object's travel parameters such as angular rate, acceleration, attitude, position, and velocity, based on the outputs of gyroscope(s) and/or accelerometer(s).

MEMS-based gyroscopes have become ubiquitous in recent years, and are often far more effective than their conventional macroscopic counterparts. MEMS-based gyroscopes are typically implemented using vibrating structures and are often referred to in the art as "vibrating structure gyroscopes" or "VSGs". Vibrating structure gyroscopes generally contain a micro-machined mass that is arranged to oscillate. Typical examples of vibrating structure gyroscopes include vibrating ring gyroscopes, vibrating tuning fork gyroscopes, and also other vibrating structures including e.g. beams, cylinders, hemispherical shells, and disks.

In general operation, the micro-machined mass is driven to oscillate in a predefined mode of vibration, typically a cos $n\theta$ mode of vibration (e.g. n=2). The driven mode of vibration is usually called a primary mode. When the gyroscope rotates, a Coriolis force is exerted on the vibrating mass, and this force may cause the mass to oscillate in a secondary mode of vibration, which is different to the primary mode. Typically, the secondary mode of vibration occurs in addition to the primary mode, and the secondary mode results in the mass oscillating along a different direction to the predefined oscillation of the primary mode.

Since the amplitude of oscillation in the secondary mode is proportional to the rate of rotation, the angular rate (e.g. measured in degrees per second) can be determined by directly detecting the amplitude of the secondary oscillation using a suitable sensor (e.g. a transducer such as an inductive or capacitive transducer)—this is known as an "open loop measurement". Alternatively, the angular rate may be measured by applying a restorative force to counter the oscillation in the secondary mode and thereby keep the mass vibrating solely in the primary mode. The restorative force is usually based on the detected amplitude of the secondary oscillation. Since the restorative force is proportional to the applied angular rate, the amplitude of the signal required to nullify the secondary mode provides a measure of the angular rate. This latter arrangement is known in the art as a "closed loop measurement". An example of how to measure the angular rate is discussed in, for example, U.S. Pat. Nos. 5,419,194 and 8,347,718.

An issue with vibrating structure gyroscopes that use permanent magnets is that the performance of the gyroscope can degrade as the magnet deteriorates over time. Inductive (as opposed to capacitive or piezoelectric) gyroscopes use a permanent magnet to create a magnetic field as part of their operation. One example of an inductive gyroscope structure is shown in FIG. 1. The inductive gyroscope 1 comprises a lower pole piece 20, an upper pole piece 24 and a permanent magnet 22 sandwiched between them. The vibrating ring 10 is located between the upper pole piece 24 and the lower pole piece 20 such that it lies within the magnetic field formed between these two pieces. The vibrating ring 10 is mounted via external mounting legs (not shown) that extend from the radially outer edge of the ring 10 to the support frame 12 such that it is able to vibrate as described above. The support frame 12 is typically mounted to a glass pedestal 14 which in turn is typically mounted upon a glass substrate 16.

In use, the lines of magnetic flux pass through the gyroscope structure (i.e. the ring 10). Conductive tracks are formed on the gyroscope structure (normally passing along one of the mounting legs, then forming a loop on a localised portion of the ring structure before returning along the same or a different mounting leg. An AC current is passed through these conductive tracks on the gyroscope structure which creates a corresponding alternating magnetic field. The attractive and repelling forces between this and the permanent magnetic create the oscillations within the gyroscope structure. In one typical arrangement eight such loops are formed into four pairs (with diametrically opposed loops forming a pair). These pairs are used to drive the primary mode of oscillation, sense (i.e. pick off) the primary mode of oscillation, sense the secondary mode of oscillation and (in the case of closed loop operation) drive the ring structure to null the secondary mode of oscillation.

The scale factor of the gyroscope is dependent on the gain of the primary drive of the system, i.e. the gain of the drive loop that maintains the amplitude of oscillation of the vibrating structure. One of the driving factors for this gain is the strength of the permanent magnet as the force on the vibrating structure is dependent on the strength of the magnetic field and also the strength of the primary drive pick-off signal is dependent on the strength of the magnetic field. Similarly, the output from the secondary pick-off is dependent on the strength of the magnetic field, as is the effect of the secondary drive on the vibrating structure.

As the magnet ages, its magnetic field strength decays slowly over time. This leads to a gradually increasing scale factor error in the gyroscope. The change in the magnet's filed strength is small in the short term (typically between 100 ppm and 1000 ppm per year even under fairly harsh operating conditions such as high temperatures), but over time, this can build up to be a significant contribution to the scale factor. For example, some gyroscopes are designed to have a 20 year lifetime. Over such timescales, the change in the magnet's field strength can cause a scale factor change of up to about 4% (where a 2% change in magnetic field strength will result in a 4% change in scale factor due to the combined effect on the secondary drive and secondary pick-off). For high accuracy, sensitive gyroscopes, this change in scale factor can be significant and it is desirable to reduce it.

A major problem with compensating for magnet aging is that it is time-dependent, but the gyroscope does not have a clock that measures time from the initial factory calibration (and it is not practical or desirable to introduce one). Therefore the degradation of the magnetic field causes an unknown degradation in the scale factor compared with the original scale factor ascertained during calibration (e.g. at manufacture). Existing systems instead take a pre-calculated estimate of the overall effect of aging over the product lifetime, take an average value and apply that as a constant scale factor correction such that the gyroscope's scale factor compensation will improve for the first half of its lifetime as it approaches the optimal value at around half of its lifetime, then will degrade again for the second half of its lifetime. For systems where high accuracy is not required, this approach is quite adequate. However, in high accuracy systems it places limits on the accuracy at the extremes of the product's lifetime.

SUMMARY

According to this disclosure, there is provided a vibrating structure gyroscope. The vibrating structure gyroscope includes: a permanent magnet; a structure arranged in a magnetic field of the permanent magnet and arranged to vibrate under stimulation from at least one primary drive electrode; and a drive system arranged to vibrate the vibrating structure at a resonance frequency. The drive system includes: the at least one primary drive electrode arranged to induce motion in the vibrating structure, at least one primary sense electrode arranged to sense motion in the vibrating structure; and a drive control loop controlling the primary drive electrode dependent on the primary sense electrode. The vibrating structure gyroscope also includes a compensation unit arranged to receive a signal from the drive system representative of a gain in the drive control loop and arranged to output a scale factor correction based on that signal.

The drive system of the vibrating structure gyroscope includes a feedback loop (the drive control loop) which attempts to maintain the correct amplitude of motion of the gyroscope's vibrating structure over the product's lifetime, over different temperatures and different operating conditions. The primary sense electrode (also known as the primary pick-off electrode) generates a signal from the motion of the vibrating structure. To provide the required feedback, the drive control loop must measure the signal from the primary sense electrode and apply a proportional signal at the primary drive electrode. The amount of gain required in this amplification will be adjusted so as to attain and maintain the desired amplitude of resonant motion. Therefore the drive control loop will typically include an Automatic Gain Control (AGC) which adjusts the gain so as to maintain a stable resonance. The drive control loop will also typically include a Phase Locked Loop (PLL) so as to maintain the phase and frequency of the drive signal to the primary drive electrode at the same phase and frequency as the resonant frequency of the vibrating structure.

As the magnet degrades (e.g. naturally over time as the material ages), the magnetic field weakens. As a result, the amplitude of motion induced in the vibrating structure will reduce and the amplitude of the pick-off signal detected at the primary sense electrode will reduce. To compensate for this, the primary drive control loop will automatically increase the gain. Therefore the gain in the drive control loop can be used as a measure of magnet degradation and can be used to compensate for the change in scale factor that is caused by that magnet degradation. By comparing the gain in the drive control loop at the time of use to a reference value of the gain in the drive control loop obtained at a time of calibration, the change in gain from the reference value can be used to calculate a change in scale factor since calibration that is due to magnet degradation. This process therefore allows the scale factor of the gyroscope to be compensated accurately throughout its life as the magnet ages. It may be noted that while most changes in the magnet's field strength are expected to come from the aging process, the field strength can also be reduced by other factors such as severe impacts or other damage. Such changes that weaken the magnet will also result in a corresponding increase in gain in the drive control loop and will also be compensated appropriately by this system.

The gain in the drive control loop can be measured in a number of different ways.

For example the signal from the drive system comprises one or more of: the amplitude of the drive signal for the primary drive electrode; the amplitude of the signal from the primary sense electrode; the gain of the drive control loop. The choice of how to measure the gain will depend on how the drive system is set up. For example, if the drive system is set to maintain a predetermined level of drive signal then the degradation of magnet strength will result in a progressively weaker pick-off signal. An increased gain will be applied to offset the decreased pick-off signal and maintain the drive signal at the desired level. In such examples, measurement of either the magnitude of the pick-off signal or the gain would be suitable. In other examples, if the drive system is set to maintain a predetermined level of pick-off signal then the degradation of magnet strength will result in the need for a progressively increasing drive signal which will be obtained by increasing the gain in the drive control loop. In such examples, measurement of either the magnitude of the drive signal or the gain would be suitable. In other examples it may be possible to use a separate sensor that detects the amplitude of the physical oscillations of the vibrating structure. In the above examples, this would also vary with the strength of the drive signal and the strength of the magnetic field, and so is also indicative of the gain in the drive control loop. Alternatively, if the drive control loop were arranged to maintain a constant magnitude of oscillation of the vibrating structure then either the magnitude of the drive control signal or the magnitude of the pick-off signal (or both) could be used as indicators of the gain in the system.

In most preferred arrangements the gain factor of the loop is derived from the amplifier, e.g. from the AGC or similar. This may be measured or output as an analogue signal or as a digital value.

The signal representative of the gain in the drive control loop is an indicator of the amount of degradation in the magnet. While in some applications this could potentially be taken in combination with a standard known reference to indicate the overall current strength of the magnet and hence the resulting overall change to scale factor, it is most likely that the reference will be dependent on a particular unit, e.g. a particular magnet in a particular device. Therefore preferably the compensation unit is arranged to output the scale factor correction based on the signal from the drive system and a stored reference value of said signal obtained during a calibration procedure. Such a calibration procedure may be performed during or shortly after manufacture (but could also be performed later if re-calibration is required) and can be used to measure the properties of the unit so as to calculate and essentially zero the scale factor at that point in time. For example the magnitude of the primary drive signal (which is dependent on the strength of the magnet) may be measured and stored as the reference value so that all subsequent changes to the magnitude of the primary drive signal can be compared against this reference and the difference from the reference value used to calculate the change in field strength and thus the change in scale factor. The compensation unit may be arranged to output the scale factor correction further based on a known relationship between said signal level, magnetic field strength and scale factor error.

The gyroscope may store the relationship as a formula or a calculation process which takes the inputs (measured value indicative of gain and any stored reference value) and outputs a calculated scale factor correction. However, for efficiency of processing, the compensation unit may include a lookup table that is arranged to provide a scale factor correction value according to the input signal from the drive system. Such a lookup table is fast to operate and while it only provides a discrete set of values, corresponding to ranges of inputs, these will generally provide adequate correction without requiring significant storage space (i.e. the size of the lookup table does not need to be very large in order to have good resolution of the output values). Of course of further resolution is required and storage space is an issue, interpolation techniques could be used in combination with the lookup table.

The values for the lookup table may be pre-calculated values generated at the time of calibration. These values may be calculated based on measurements of the properties of the drive control loop and/or the vibrating structure in the presence of the magnet while the gyroscope is mounted on a test rig and is undergoing known rotation rates (e.g. zero rotation and/or one or more fixed speeds of rotation). The values may be calculated based on a known relationship between the rate of degradation of magnet strength and the corresponding rate of change of the appropriate properties of the drive control loop. Such a relationship may have been established through prior research. Alternatively, if appropriate, the strength and/or degradation rate of the particular magnet in the unit under calibration may be tested as part of the calibration process and used in the calculation of the values for the lookup table (or stored for use in a stored formula or algorithm in cases where a lookup table is not).

In many cases, the temperature affects the operation of the gyroscope and therefore the scale factor and the gain/drive signal/pick-off signal will also vary with temperature. Therefore the compensation unit may be arranged to receive a temperature signal (e.g. from a temperature sensor) and to output a scale factor correction based on both the signal from the drive system and the temperature signal. Accordingly the compensation unit may include a lookup table that is arranged to provide a scale factor correction value according to both the signal from the drive system and the temperature signal.

It is also known that prolonged exposure to high temperatures (which may occur during certain storage conditions or through long periods of operation) can cause the magnet's field strength to degrade faster. The system will again automatically be able to adjust for this as the drop in field strength (for whatever reason) will result in a corresponding change in the drive control loop.

The vibrating structure gyroscope may further comprise: a sensing system arranged to sense the vibrations of the vibrating structure and arranged to output an angular rate signal based on the sensed vibrations; and wherein the vibrating structure gyroscope is arranged to apply the scale factor correction to the angular rate signal to provide an output of the vibrating structure gyroscope. The sensing system is used to detect the secondary mode of vibration (in a vibratory ring gyroscope, this is normally at an angle of 45 degrees to the primary (drive) mode of vibration when it is operated in a cos 2θ mode), the amplitude of which is related to the rate of rotation of the gyroscope.

According to another aspect of this disclosure there is provided a method of calibrating a gyroscope, comprising: providing a gyroscope as described above; evaluating the strength of the drive system in a test environment while the gyroscope is not rotating; and storing in the compensation unit information based on that evaluation that allows determination of the scale factor correction from the signal from the drive system.

The evaluation ties the current strength of the drive system to the current strength of the magnet and therefore allows future changes in the drive strength to be attributed to changes in the magnetic field strength. The information stored in the compensation unit may include information on how changes in the drive strength correspond to changes in the magnetic field strength. This may be for example by way of a formula or a lookup table. This information could be pre-programmed or preloaded into the compensation unit before the calibration where it is not expected to change from one unit to another. Alternatively, this information could be stored as part of the calibration process, allowing specific or updated information to be loaded that more closely matches a particular magnet or batch of magnets used in the unit. Preferably therefore the method further comprises storing in the compensation unit information on the relationship between the strength of the drive system and the strength of the magnetic field of the permanent magnet.

As discussed above in relation to the gyroscope, the step of evaluating may comprise evaluating the strength of the drive system across a range of temperatures. The step of storing may comprise storing the information in a lookup table.

BRIEF DESCRIPTION OF DRAWINGS

One or more non-limiting examples will now be described, by way of example only, and with reference to the accompanying figures in which:

Referring to FIG. 1, an inductive vibrating ring gyroscope 1 is shown. A ring shaped resonator 10 is attached to a support frame 12 by flexible support legs (not shown) that extend from an outer circumference of the resonator 10 to the support frame 12 and which allow the resonator 10 to vibrate in primary mode and a secondary mode of oscillation. The support frame 12 is mounted to a glass pedestal 14 which, in turn, is mounted on a glass substrate 16.

Figure 1:
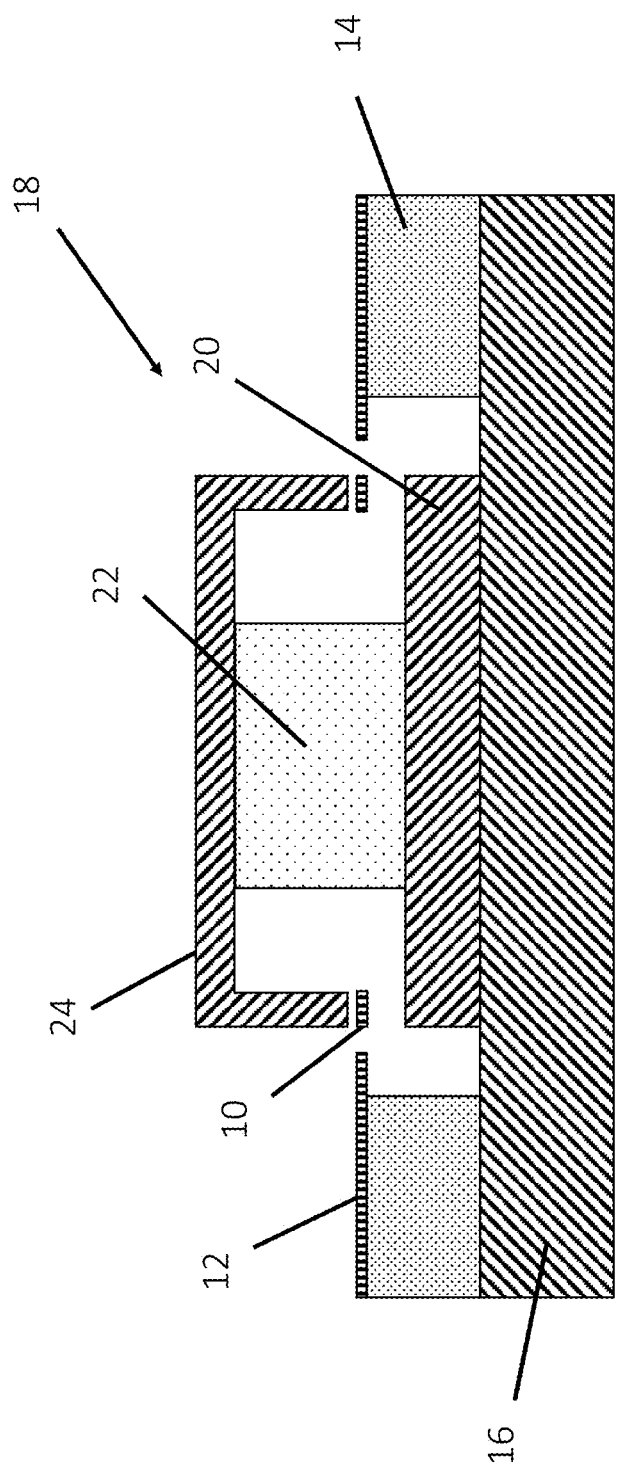
FIG. 1 shows an example arrangement of an inductive vibrating structure gyroscope.

A magnet assembly 18 comprises a lower pole piece 20, an upper pole piece 24 and a permanent magnet 22 which is located between the lower pole piece 20 and the upper pole piece 24. The lower pole piece is mounted to the substrate 16 underneath the resonator 10 while the upper pole piece 24 is formed as a cap, the rim of which is formed above the resonator 10. A magnetic field generated by permanent magnet 22 is directed through the resonator 10.

Figure 2:
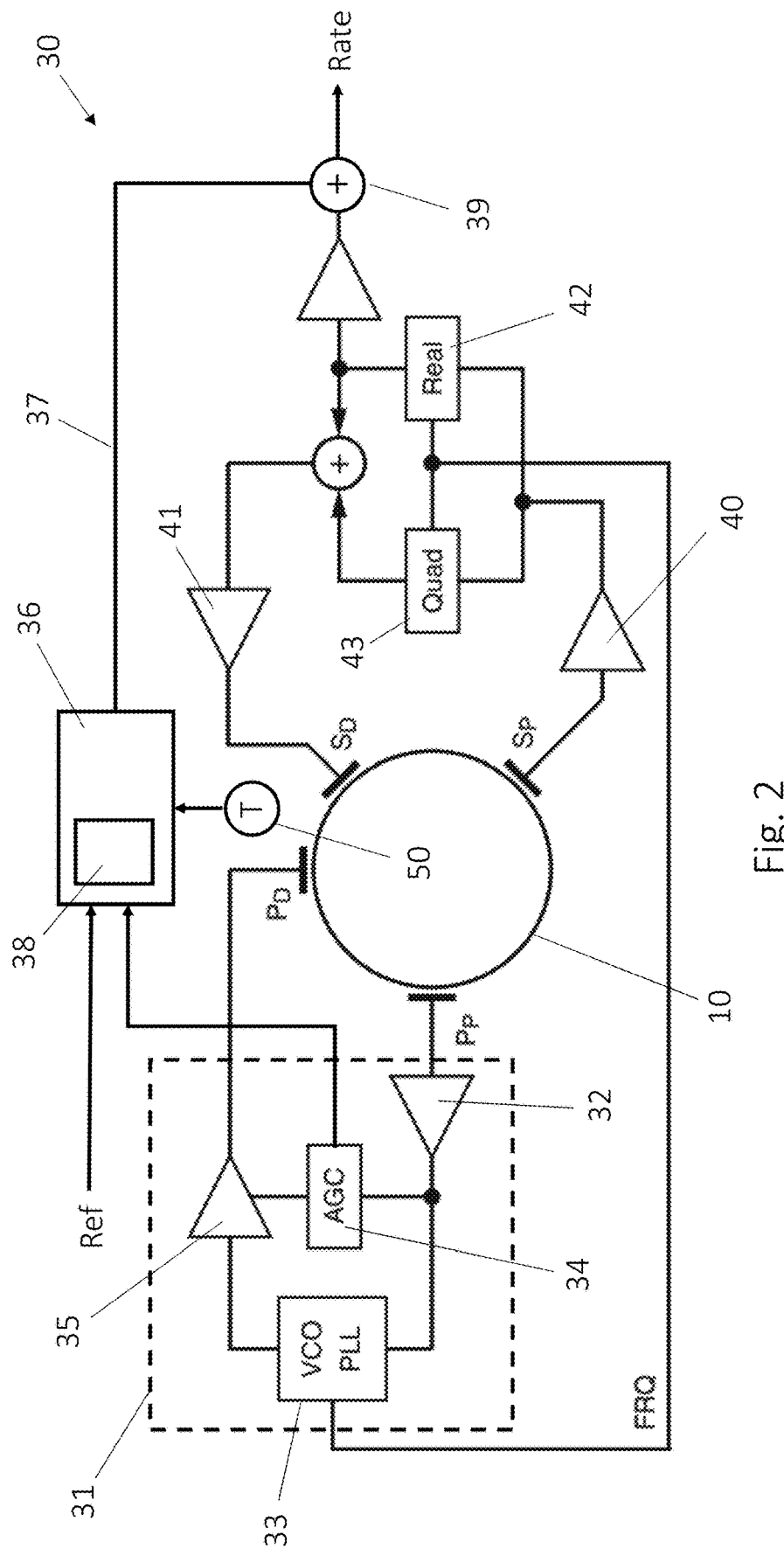
FIG. 2 shows an example of a gyroscope with scale factor compensation.

FIG. 2 shows an inductive vibrating structure gyroscope 30 together with its control and detection systems. The physical structure of the resonator 10 and magnet assembly 18 of the gyroscope 30 may be as shown in FIG. 1.

A drive system 31 is arranged to provide a drive signal to the primary drive electrode $P_D$ (in practice this may be a diametrically opposed pair of electrodes). A pick-off signal is generated by primary pick-off electrode $P_P$ (the primary sense electrode) which is situated at a position 90 degrees round the resonator ring 10 from the drive electrode $P_D$. The pick-off signal is amplified by amplifier 32 and is provided to Voltage Controlled Oscillator/Phase Lock Loop circuit 33 which adjusts the phase and frequency of the signal to lock onto the resonant frequency of the resonator 10 so as to maintain the primary mode of oscillation. The adjusted signal is provided through amplifier 35 to the primary drive electrode $P_D$ to maintain the resonance. The pick-off signal is also provided in parallel to Automatic Gain Control (AGC) circuit 34 which adjusts the gain of amplifier 35 to ensure that amplitude of resonance is maintained.

In the example of FIG. 2 the AGC 34 receives the pick-off signal (actually the amplified version of the pick-off signal output from amplifier 32) and compares it against a threshold. If the magnitude of the pick-off signal is lower than the threshold, it increases the gain of amplifier 35, while if the magnitude of the pick-off signal is greater than the threshold, it decreases the gain of amplifier 35. This changes the magnitude of the drive signal which in turn changes the amplitude of the resonator's oscillations which in turn changes the amplitude of the pick-off signal. Thus the primary drive control loop (comprising the amplifier 32, VCO/PLL 33, AGC 34 and amplifier 35) constantly adjusts the signals so as to maintain the resonator 10 in resonance and at the correct amplitude of motion.

The gain of AGC 34 is also provided as an output which is provided to compensation unit 36. Compensation unit 36 outputs a scale factor correction 37 based on the input from AGC 34.

In some examples, compensation unit 36 may calculate the scale factor correction 37 solely on the basis of the input from AGC 34 and stored information (such as a formula and known parameter values). In other examples, the compensation unit may additionally take into account a reference value Ref which is acquired and stored during a calibration procedure and which indicates the AGC gain that was required at the time of calibration (and therefore represents the state of the magnet at that time). In some other examples the compensation unit 36 may perform a lookup of the current gain value from AGC 34 in a lookup table 38 which has been pre-calculated and stored within compensation unit 36 at the time of calibration. The lookup table has pre-calculated scale factor corrections that correspond to certain magnet strengths and which will therefore correspond to certain gain levels of the AGC 34.

The scale factor correction 37 is applied to the rate signal at 39 to provide a corrected rate output ("Rate" in FIG. 2) of the gyroscope 30.

The rate signal is acquired via secondary pick-off electrode $S_P$ and amplifier 40.

The output from the secondary pick-off contains both the 'Real' and 'Quadrature' components in the observed signal, which are orthogonal in phase and determined through the frequency input from the primary loop. The 'Real' component provides the desired gyroscope output of actual rate applied. The 'Quad' component is generated through imperfections in the system that cause energy to be coupled into the secondary motion and this quadrature (i.e. 90°) component does not contribute to the rate output.

In an open-loop example, the output of amplifier 40 is passed through a demodulator 42 to extract the Real component and this is used as the rate output (to be corrected by scale factor correction 37 at 39). In closed-loop examples such as shown in FIG. 2, the output of amplifier 40 is also passed through a demodulator 43 to extract the Quad component. The Real and Quad components are recombined and used to generate a secondary drive signal via amplifier 41 which is applied to secondary drive electrode SD so as to null the secondary mode motion of the resonator 10. The magnitude of the Real part of the signal required to null this motion is then used as the rate output (to be corrected by scale factor correction 37 at 39).

It will be appreciated that the AGC 34 will also compensate for other operating conditions such as temperature variations. To take account of this, the compensation unit 36 may also have a temperature input from temperature sensor 50. In such examples, the formula or lookup table 38 stored in compensation unit 36 also takes account of temperature. For example the lookup table 38 could have entries for a number of different gain levels, and for each gain level, could provide a scale factor compensation output for each of a plurality of temperatures.

According to this system, the scale factor of the gyroscope can be corrected throughout the lifetime of the product as the magnet ages and/or degrades. This may be achieved as follows:

Firstly, during manufacture the gyro primary drive level is characterized over temperature. This may be done on a test rig in a well-controlled environment and with the gyroscope in known states of rotation (e.g. stationary or rotating at a known angular rate).

Secondly, during use the gyroscope measures the required primary drive level for the gyro (e.g. directly or via the gain of the AGC) and compares against the information obtained during calibration.

Thirdly, the gyroscope uses this data and the comparison to correct for the variation in scale factor due to the aging of the magnet since manufacture (or since calibration). An increase in primary drive correlates to a reduction in magnet strength and therefore a positive increase in scale factor.

In order to allow for the calibration information (temperature and drive level) to be stored in the gyroscope, the gyroscope may be provided with a data transfer interface. This may take the form of a bi-direction communication interface which also allows for output of the gyroscope data during use.

This scale factor compensation scheme is particularly suited to high performance gyroscopes. The scale factor improvement will be dependent on the particular gyroscope design, but by way of example, in one existing gyroscope with a 20 year life time and a magnet degradation of 100 ppm per year, the existing scheme will have a constant scale factor correction that is off by around 1000 ppm at the start and end of the product's life. The correction provided by this disclosure can completely or almost completely cancel out this contributor to scale factor and thus results in a scale factor improvement of up to 1000 ppm compared with the existing system.

In one particular example a SmCo magnet was found to have an aging coefficient of around 0.0532 ppm per hour when operated at a relatively high temperature of 165 degrees C. (high temperatures are known to increase the aging effect in magnets). Over a 20 year product life this equates to over 9300 ppm, i.e. almost 1 percent. This degradation creates a change in scale factor that is significant for high performance gyroscopes and the present disclosure provides a way to track and compensate for this change in scale factor.

It will be appreciated that there are other sources of scale factor error that may also be compensated separately from or in addition to this process.

The invention claimed is:

1. A vibrating structure gyroscope, comprising:
   a permanent magnet;
   a vibrating structure arranged in a magnetic field of the permanent magnet and arranged to vibrate under stimulation from at least one primary drive electrode;
   a drive system arranged to vibrate the vibrating structure at a resonance frequency, the drive system comprising:
      the at least one primary drive electrode arranged to induce motion in the vibrating structure,
      at least one primary sense electrode arranged to sense motion in the vibrating structure; and
      a drive control loop controlling the primary drive electrode dependent on the primary sense electrode; and
   a compensation unit arranged to receive a signal from the drive system representative of a gain in the drive control loop and arranged to output a scale factor correction, for application to a rate signal of the gyroscope based on the signal.

2. The vibrating structure gyroscope as claimed in claim 1, wherein the signal from the drive system comprises one or more of:
   the amplitude of the drive signal for the primary drive electrode;
   the amplitude of the signal from the primary sense electrode; and
   the gain of the drive control loop.

3. The vibrating structure gyroscope as claimed in claim 1, wherein the compensation unit is arranged to output the scale factor correction based on the signal from the drive system and a stored reference value, wherein the stored reference value is a value of a signal from the drive system obtained during a calibration procedure.

4. A vibrating structure gyroscope as claimed in claim 3, wherein the compensation unit is arranged to output the scale factor correction further based on a known relationship between a signal level of the signal from the drive system, magnetic field strength and scale factor error.

5. The vibrating structure gyroscope as claimed in claim 1, wherein the compensation unit includes a lookup table that is arranged to provide a scale factor correction value according to the input signal from the drive system.

6. The vibrating structure gyroscope as claimed in claim 1, wherein the compensation unit is arranged to receive a temperature signal and to output the scale factor correction based on both the signal from the drive system and the temperature signal.

7. The vibrating structure gyroscope as claimed in claim 6, wherein the compensation unit includes a lookup table that is arranged to provide a scale factor correction value according to both the signal from the drive system and the temperature signal.

8. The vibrating structure gyroscope as claimed in claim 1, further comprising:
   a sensing system arranged to sense the vibrations of the vibrating structure and arranged to output an angular rate signal based on the sensed vibrations;
   wherein the vibrating structure gyroscope is arranged to apply the scale factor correction to the angular rate signal to provide an output of the vibrating structure gyroscope.

9. A method of calibrating a gyroscope, comprising:
   providing a gyroscope as claimed in claim 1;
   evaluating a strength of a signal from the drive system in a test environment while the gyroscope is not rotating; and
   storing in the compensation unit information based on the evaluation of the drive system that allows determination of the scale factor correction from the signal from the drive system.

10. The method of as claimed in claim 9, further comprising storing in the compensation unit information on a relationship between the strength of the signal from the drive system and the magnetic field of the permanent magnet.

11. The method as claimed in claim 9, wherein evaluating comprises evaluating the strength of the signal from the drive system across a range of temperatures.

12. The method as claimed in claim 9, wherein storing comprises storing the information in a lookup table.

* * * * *